US012686918B2

(12) United States Patent (10) Patent No.: US 12,686,918 B2

Zamarian et al. (45) Date of Patent: Jul. 21, 2026

(54) CLEANING OPERATIONS BASED ON DEPOSITION THICKNESS

(71) Applicant: Applied Materials, Inc., Santa Clara, CA (US)

(72) Inventors: Victor Zamarian, Cupertino, CA (US); Mitesh Harshad Sanghvi, Dublin, CA (US); Venkatanarayana Shankaramurthy, San Jose, CA (US); Yuhyuk Cho, San Jose, CA (US); Deepesh Rai, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 396 days.

(21) Appl. No.: 18/093,681

(22) Filed: Jan. 5, 2023

(65) Prior Publication Data

US 2024/0229234 A1 Jul. 11, 2024

(51) Int. Cl.
C23C 16/44 (2006.01)
B08B 3/08 (2006.01)
(Continued)

(52) U.S. Cl.
CPC ............ C23C 16/4405 (2013.01); B08B 3/08 (2013.01); B08B 5/00 (2013.01); B08B 7/0035 (2013.01);
(Continued)

(58) Field of Classification Search
CPC ... C23C 16/4405; C23C 16/4407; B08B 3/08; B08B 5/00; B08B 7/0035; B08B 13/00;
(Continued)

(56) References Cited

U.S. PATENT DOCUMENTS

| | | | | |
|---|---|---|---|---|
| 2004/0261815 A1* | 12/2004 | Pavone | ............... | C23C 16/4405 |
| | | | | 134/25.1 |
| 2005/0109461 A1* | 5/2005 | Sun | ........................... | B08B 7/00 |
| | | | | 156/345.35 |
| 2005/0247877 A1* | 11/2005 | Mackin | ................. | C23C 14/547 |
| | | | | 250/341.1 |
| 2010/0095891 A1* | 4/2010 | Zhao | ..................... | C23C 16/458 |
| | | | | 118/723 E |

(Continued)

FOREIGN PATENT DOCUMENTS

| | | | |
|---|---|---|---|
| CN | 114875382 A | | 8/2022 |
| KR | 2019-0063754 A | * | 6/2019 |
| KR | 102185735 B1 | | 12/2020 |

OTHER PUBLICATIONS

Canales et al., Window of deposition description and prediction of deposition efficiency via machine learning techniques in cold spraying, Aug. 1, 2020, Surface & Coatings Technology, p. 1-10 (Year: 2020).*

(Continued)

*Primary Examiner* — Kidest Worku

(74) *Attorney, Agent, or Firm* — Lowenstein Sandler LLP

(57) ABSTRACT

A method includes identifying deposition thickness property data associated with an amount of material deposited via one or more substrate processing operations of a process recipe performed in a processing chamber. The method further includes determining, based on the deposition thickness property data and a variable clean time relationship of the process recipe, cleaning operation parameters. The method further includes causing, based on the cleaning operation parameters, a cleaning operation in the processing chamber.

20 Claims, 5 Drawing Sheets

(51) Int. Cl.

| | |
|---|---|
| *B08B 5/00* | (2006.01) |
| *B08B 7/00* | (2006.01) |
| *B08B 13/00* | (2006.01) |
| *G05B 19/4155* | (2006.01) |

(52) U.S. Cl.

CPC .......... *B08B 13/00* (2013.01); *C23C 16/4407* (2013.01); *G05B 19/4155* (2013.01); *G05B 2219/35109* (2013.01); *G05B 2219/45031* (2013.01)

(58) Field of Classification Search

CPC ...... G05B 19/4155; G05B 2219/35109; G05B 2219/45031

See application file for complete search history.

(56) References Cited

U.S. PATENT DOCUMENTS

| | | | | |
|---|---|---|---|---|
| 2016/0307812 | A1* | 10/2016 | Kenane | H01L 21/67253 |
| 2019/0120775 | A1* | 4/2019 | Sawlani | G06F 17/15 |
| 2020/0255940 | A1* | 8/2020 | Kwon | H01J 37/32862 |
| 2020/0299838 | A1* | 9/2020 | Phillips | H01L 22/26 |
| 2021/0116895 | A1* | 4/2021 | Paul | G06F 11/3447 |
| 2021/0407065 | A1* | 12/2021 | Dhandapani | G06T 7/60 |
| 2022/0344184 | A1* | 10/2022 | Sadeghi | H01J 37/32935 |

OTHER PUBLICATIONS

International Search Report and Written Opinion for International Application No. PCT/US2023/35254, mailed Feb. 6, 2024, 11 Pages.

* cited by examiner

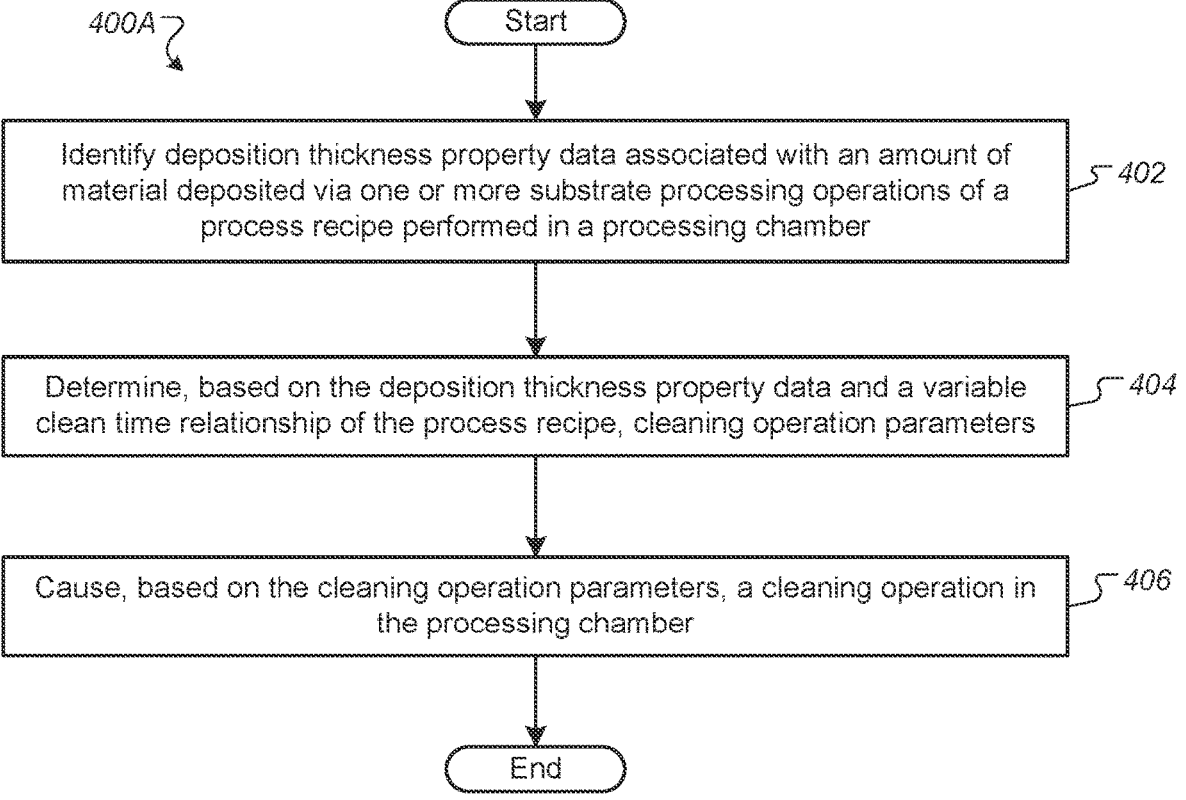

400A

Start

Identify deposition thickness property data associated with an amount of material deposited via one or more substrate processing operations of a process recipe performed in a processing chamber ⟋ 402

Determine, based on the deposition thickness property data and a variable clean time relationship of the process recipe, cleaning operation parameters ⟋ 404

Cause, based on the cleaning operation parameters, a cleaning operation in the processing chamber ⟋ 406

End

FIG. 4A

CLEANING OPERATIONS BASED ON DEPOSITION THICKNESS

TECHNICAL FIELD

The present disclosure relates to cleaning operations, and, more particularly, to cleaning operations based on deposition thickness.

BACKGROUND

Products can be produced by performing one or more manufacturing processes using manufacturing equipment. For example, substrate processing equipment can be used to produce semiconductor substrates via substrate processing operations.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

An aspect of the disclosure includes a method including identifying deposition thickness property data associated with an amount of material deposited via one or more semiconductor processing operations of a process recipe performed in a processing chamber. The method further includes determining, based on the deposition thickness property data and a variable clean time relationship of the process recipe, cleaning operation parameters. The method further includes, causing, based on the cleaning operation parameters, a cleaning operation in the processing chamber.

A further aspect of the disclosure includes a non-transitory computer-readable storage medium including instructions that, when executed by a processing device operatively coupled to a memory, performs operations. The operations include identifying deposition thickness property data associated with an amount of material deposited via one or more substrate processing operations of a process recipe performed in a processing chamber. The operations further include determining, based on the deposition thickness property data and a variable clean time relationship of the process recipe, cleaning operation parameters. The operations further include causing, based on the cleaning operation parameters, a cleaning operation in the processing chamber.

A further aspect of the disclosure includes a system including a memory and a processing device coupled to the memory. The processing device is to identify deposition thickness property data associated with an amount of material deposited via one or more substrate processing operations of a process recipe performed in a processing chamber. The processing device is further to determine, based on the deposition thickness property data and a variable clean time relationship of the process recipe, cleaning operation parameters. The processing device is further to cause, based on the cleaning operation parameters, a cleaning operation in the processing chamber.

BRIEF DESCRIPTION OF THE DRAWINGS

The present disclosure is illustrated by way of example, and not by way of limitation in the figures of the accompanying drawings.

FIGS. 4A-C are flow diagrams of methods associated with cleaning operations based on deposition thickness, according to certain embodiments.

DETAILED DESCRIPTION

Figure 1:
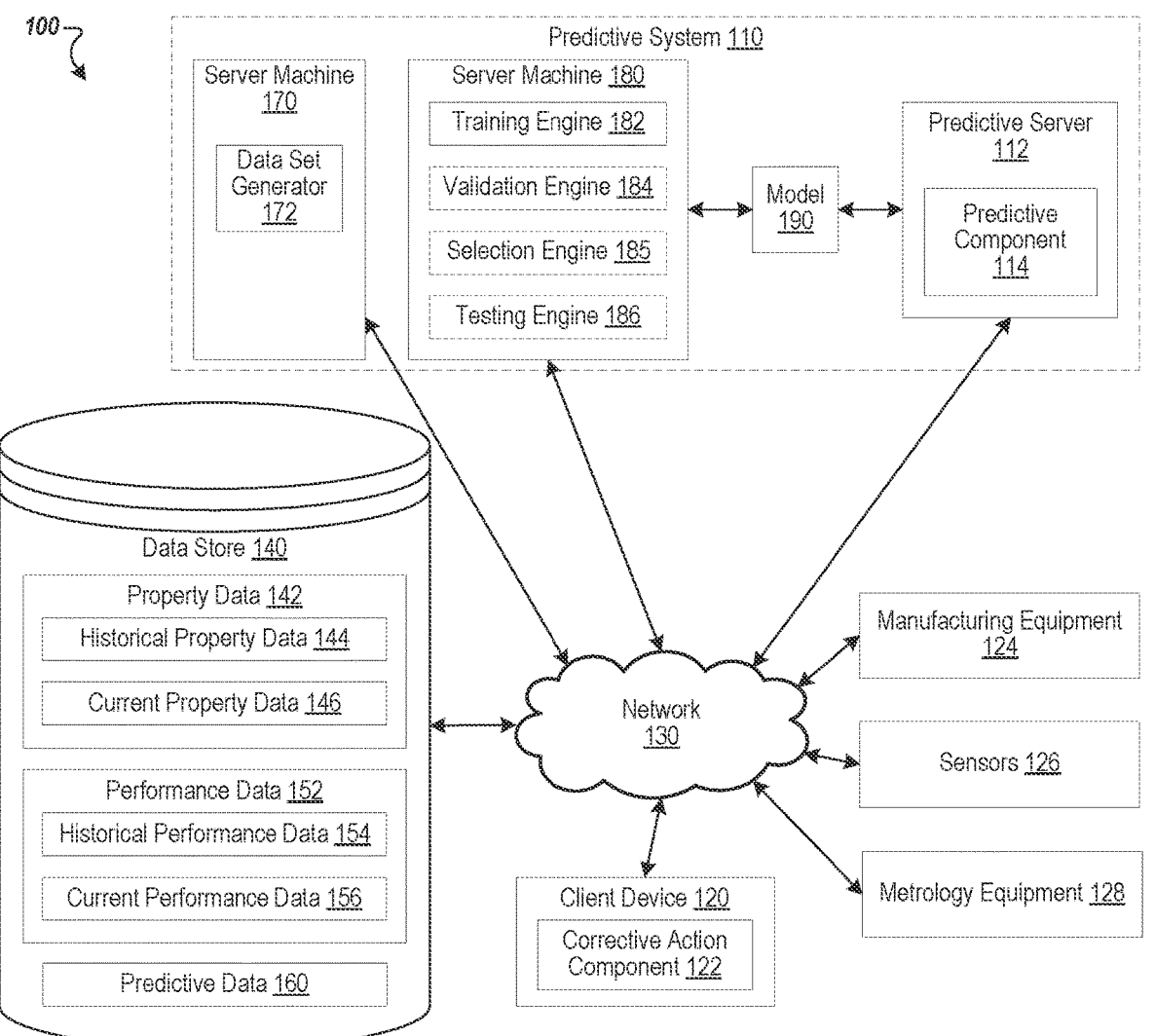
FIG. 1 is a block diagram illustrating an example system architecture, according to certain embodiments.

Described herein are technologies directed to cleaning operations based on deposition thickness (e.g., deposition thickness based cleans, optimizing chamber cleans by utilizing deposition thickness counters).

Products can be produced by performing one or more manufacturing processes using manufacturing equipment. For example, substrate processing equipment can be used to produce substrates (e.g., semiconductor devices, semiconductors, wafers, etc.) via substrate processing operations (e.g., semiconductor processing operations, semiconductor manufacturing processes). The substrate processing equipment can, according to a process recipe, deposit multiple layers of film on the surface of the substrate and can perform etch processes to form patterns in the deposited film. For example, substrate processing equipment can perform a chemical vapor deposition (CVD) process to deposit alternative layers on the substrate.

During the substrate processing operations, residue (e.g., deposition residue) can build up in a processing chamber (e.g., on walls of the processing chamber). Processing chambers can have multiple substrate processing areas or slots. After a deposition operation, the deposition residual thickness can vary for each individual substrate processing area (e.g., slot) within a single processing chamber. For example, a processing chamber with two substrate processing areas (e.g., slots) may use a first substrate processing area during a deposition operation while a second substrate processing area is not used during the deposition operation. Following such an operation, the first substrate processing area has more deposition residue accumulated inside and the second substrate processing area has less (e.g., has no) deposition residue accumulated from the deposition operation.

Substrate processing recipes conventionally include fixed cleaning operations (e.g., time of clean, intensity of clean, etc.) that have fixed cleaning operation parameters for a processing chamber (e.g., following a deposition process). Conventionally, a processing recipe includes a fixed clean time following at least one deposition operation. For example, following multiple deposition operations (e.g., CVD), the processing chamber may be cleaned for a fixed amount of time.

These fixed cleaning operations with fixed cleaning operation parameters result in over-cleaning and/or under-cleaning processing chambers. For example, a fixed cleaning time can be used to clean both the first and second substrate processing areas of a processing chamber. Such fixed clean times can result in under-cleaning and over-cleaning the processing chamber and/or the first and second substrate processing areas. Over-cleaning a processing chamber causes contamination in the processing chamber (e.g., cleaning agent particles such as aluminum fluoride remain after cleaning operation is complete) and those particles lead to defective substrates. Over-cleaning a processing chamber can also damage the processing chamber leading to non-uniformity between substrates and damaged manufacturing equipment. Under-cleaning a processing chamber causes substrates to be processed in a dirty chamber and leads to defective substrates and non-uniformity between substrates (e.g., substrates processed in an optimally cleaned processing chamber have less defects than those processed in a dirty chamber due to under-cleaning).

The devices, systems, and methods disclosed herein provide cleaning operations based on deposition thickness (e.g., optimized chamber cleans by utilizing deposition thickness counters).

A processing device identifies deposition thickness property data associated with an amount of material deposited (e.g., on a substrate, on walls of the processing chamber, etc.) via one or more substrate processing operations (e.g., semiconductor processing operations) of a process recipe performed in a processing chamber. In some embodiments, the deposition thickness property data includes a type of material and/or a thickness counter (e.g., units of thickness deposited, units of a thickness of a particular material deposited). In some embodiments, the processing chamber includes substrate processing areas. In some embodiments, the deposition thickness property data is derived from the deposition operation recipe (e.g., the deposition thickness is equal to the expected deposition thickness of the deposition operation).

The processing device determines, based on the deposition thickness property data and a variable clean time relationship (e.g., an equation, function, mathematical relationship, etc.) of the process recipe, cleaning operation parameters. In some embodiments, the cleaning operation parameters include a quantity of clean time. In some embodiments, the processing device is to further determine the cleaning operation parameters based on the deposition thickness property data of at least one of the substrate processing areas and the variable clean time relationship of the process recipe. In some embodiments, the processing device is to determine the cleaning operation parameters by providing the deposition thickness property data as input to a trained machine learning model associated with the variable clean time relationship and receiving, from the trained machine learning model, output associated with predictive data, where the cleaning operation parameters are based on the predictive data. In some embodiments, the trained machine learning model is trained using data input including historical deposition thickness property data and target output including historical performance data.

The processing device causes, based on the cleaning operation parameters, a cleaning operation (e.g., of a particular duration, intensity, etc.) in the processing chamber. In some embodiments, the processing device is to further reset the thickness counter after the cleaning operation is performed (e.g., resetting the thickness counter to be equal to zero).

Aspects of the present disclosure result in technological advantages. The present disclosure avoids over-cleaning and under-cleaning processing chambers and/or substrate processing areas. The present disclosure further avoids causing contamination in processing chambers which leads to defective substrates. The present disclosure further avoids damaging processing chambers which leads to non-uniformity between substrates and damaged manufacturing equipment.

The present disclosure further avoids processing substrates in dirty processing chambers which leads to defective substrates and non-uniformity between substrates.

Although some embodiments of the present disclosure describes cleaning operations based on deposition thickness in some embodiments, the present disclosure can be used for other operations (e.g., etching operations, maintenance operations, repair operations, etc.) based on other types of property data (e.g., image data, defect data, temperature data, etc.).

FIG. 1 is a block diagram illustrating an exemplary system 100 (exemplary system architecture), according to certain embodiments. The system 100 (e.g., corrective action component 122 and/or predictive component 114) can perform the methods described herein (e.g., methods 400A-C of FIGS. 4A-C). The system 100 includes a client device 120, manufacturing equipment 124, sensors 126, metrology equipment 128, a predictive server 112, and a data store 140. In some embodiments, the predictive server 112 is part of a predictive system 110. In some embodiments, the predictive system 110 further includes server machines 170 and 180.

In some embodiments, one or more of the client device 120, manufacturing equipment 124, sensors 126, metrology equipment 128, predictive server 112, data store 140, server machine 170, and/or server machine 180 are coupled to each other via a network 130 for generating predictive data 160 to perform deposition thickness based cleans. In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

In some embodiments, the client device 120 includes a computing device such as Personal Computers (PCs), laptops, mobile phones, smart phones, tablet computers, netbook computers, etc. In some embodiments, the client device 120 includes a corrective action component 122. In some embodiments, the corrective action component 122 may also be included in the predictive system 110 (e.g., machine learning processing system). In some embodiments, the corrective action component 122 is alternatively included in the predictive system 110 (e.g., instead of being included in client device 120). Client device 120 includes an operating system that allows users to one or more of: consolidate, generate, view, or edit data; provide data to the predictive system 110 (e.g., machine learning processing system); etc.

In some embodiments, corrective action component 122 receives one or more of user input (e.g., via a Graphical User Interface (GUI) displayed via the client device 120), property data 142, performance data 152, etc. In some embodiments, property data 142 may be deposition thickness property data (e.g., deposition thickness, deposition residual thickness, thickness counters, etc.). In some embodiments, the corrective action component 122 transmits data (e.g., user input, property data 142, performance data 152, etc.) to the predictive system 110, receives predictive data 160 from the predictive system 110, determines a corrective action based on the predictive data 160, and causes the corrective action to be implemented. In some embodiments, the corrective action component 122 stores data (e.g., user input, property data 142, performance data 152, etc.) in the data store 140 and the predictive server 112 retrieves the data from the data store 140. In some embodiments, the predictive server 112 stores output (e.g., predictive data 160) of the trained machine learning model 190 in the data store 140 and the client device 120 retrieves the output from the data store 140. In some embodiments, the corrective action component 122 receives an indication of a corrective action (e.g., based on predictive data 160) from the predictive system 110 and causes performance of the corrective action.

In some embodiments, the corrective action may be, for example, determining cleaning operation parameters, updating a process recipe, updating a cleaning operation, adjusting a variable clean time based on deposition thickness property data, and/or the like. In some embodiments, the corrective action may be, for example, training a machine learning model (e.g., using data input including historical deposition thickness property data and target output including historical performance data), using a trained machine learning model (e.g., to receive output associated with predictive data, where the cleaning operation parameters are based on the predictive data), and/or the like.

In some embodiments, the predictive data 160 is associated with a corrective action. In some embodiments, a corrective action is associated with one or more of cleaning one or more portions of manufacturing equipment 124 (e.g., processing chamber, substrate processing area, etc.), repairing one or more portions of the manufacturing equipment 124, replacing one or more portions of the manufacturing equipment 124, Computational Process Control (CPC), Statistical Process Control (SPC) (e.g., SPC to compare to a graph of 3-sigma, etc.), Advanced Process Control (APC), model-based process control, preventative maintenance, design optimization, updating of manufacturing parameters, updating cleaning operation parameters, wafer recipe modification, feedback control, machine learning modification, and/or the like.

In some embodiments, the corrective action includes determining cleaning operation parameters (e.g., length of time, intensity of clean, temperature, pressure, type of cleaning agent used, etc.). In some embodiments, the corrective action includes providing machine learning (e.g., to update cleaning operation parameters, clean recipes, or process recipes based on the predictive data 160).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 identifies (e.g., receives from the client device 120, retrieves from the data store 140, etc.) property data 142 (e.g., deposition thickness property data) and generates predictive data 160 associated with performance of a corrective action (e.g., cleaning operations based on deposition thickness, updating cleaning operations of the recipe based on deposition thickness, determine cleaning operation parameters of cleaning operations, etc.). In some embodiments, the predictive component 114 uses one or more trained machine learning models 190 to determine the predictive data 160. In some embodiments, trained machine learning model 190 is trained using historical property data 144 and historical performance data 154.

In some embodiments, the predictive system 110 (e.g., predictive server 112, predictive component 114) generates predictive data 160 using supervised machine learning (e.g., supervised data set, historical property data 144 labeled with historical performance data 154, etc.). In some embodiments, the predictive system 110 generates predictive data 160 using semi-supervised learning (e.g., semi-supervised data set, performance data 152 is a predictive percentage, etc.). In some embodiments, the predictive system 110 generates predictive data 160 using unsupervised machine learning (e.g., unsupervised data set, clustering, clustering based on historical property data 144, etc.).

In some embodiments, the manufacturing equipment 124 includes one or more of a processing chamber, deposition chamber, cluster tool, wafer backgrind systems, wafer saw equipment, die attach machines, wirebonders, die overcoat systems, molding equipment, hermetic sealing equipment, metal can welders, deflash/trim/form/singulation (DTFS) machines, branding equipment, lead finish equipment, and/or the like. In some embodiments, the manufacturing equipment 124 is part of a substrate processing system (e.g., integrated processing system). The manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber. In some embodiments, the manufacturing equipment 124 includes components of substrate processing systems. In some embodiments, the property data 142 of a processing chamber or a substrate results from the processing chamber performing one or more substrate processing operations (e.g., semiconductor processing operations, deposition, etching, heating, cooling, transferring, processing, flowing, etc.).

In some embodiments, the sensors 126 provide property data 142 (e.g., sensor values, such as historical sensor values and current sensor values) of the processing chamber (e.g., deposition thickness property data) or of a substrate processed by manufacturing equipment 124.

In some embodiments, the sensors 126 and/or metrology equipment 128 include one or more of a metrology tool such as ellipsometers (used to determine the properties and surfaces of thin films by measuring material characteristics such as layer thickness, optical constants, surface roughness, composition, and optical anisotropy), ion mills (used to prepare heterogeneous bulk materials when wide areas of material are to be uniformly thin), capacitance-voltage (C-V) systems (used to measure the capacitance versus voltage and capacitance versus time (C-t) characteristics of substrates, such as semiconductor devices), interferometers (used to measure distances in terms of wavelength, and to determine wavelengths of particular light sources), source measure units (SME) magnetometers, optical and imaging systems, profilometers, wafer probers (used to test a semiconductor wafer before it is separated into individual dies or chips), imaging stations, critical-dimension scanning electron microscope (CD-SEM, used to ensure the stability of the manufacturing process by measuring critical dimensions of substrates), reflectometers (used to measure the reflectivity and radiance from a surface), resistance probes (used to measure the resistivity of thin-films), resistance high-energy electron diffraction (RHEED) system (used to measure or monitor crystal structure or crystal orientation of epitaxial thin-films of silicon or other materials), X-ray diffractometers (used to unambiguously determine crystal structure, crystal orientation, film thickness and residual stress in silicon wafers, epitaxial films, or other substrates), and/or the like.

In some embodiments, the property data 142 is used for equipment health and/or product health (e.g., product quality). In some embodiments, the property data 142 is received over a period of time.

In some embodiments, sensors 126 and/or metrology equipment 128 provide property data 142 including one or more of morphology data, size attribute data, dimensional attribute data, image data, scanning electron microscope (SEM) images, energy-dispersive x-ray (EDX) images, defect distribution data, spatial location data, elemental analysis data, wafer signature data, chip layer, chip layout data, edge data, grey level data, signal to noise data, temperature data, spacing data, electrical current data, power data, voltage data, and/or the like.

In some embodiments, property data 142 includes morphology data (e.g., data that relates to the form of a substrate, such as thickness of deposition layers or residual thickness). In some embodiments, property data 142 includes size attribute data (e.g., data describing the size of attributes of a substrate). In some embodiments, property data 142 includes dimensional attribute data (e.g., data that describes the dimensions of attributes of a substrate). In some embodiments, property data 142 includes SEM images (e.g., images captured by a scanning electron microscope using a focused beam of electrons to scan a surface of a substrate to create a high-resolution image). In some embodiments, property data 142 includes EDX images (e.g., images generated from data that is collected using an x-ray technique to identify the elemental composition of materials). In some embodiments, property data 142 includes defect distribution data (e.g., data that describes the spatial distribution, temporal distribution, etc. of defects on a substrate). In some embodiments, property data 142 includes spatial location data (e.g., data that describes the spatial location of attributes, defects, elements, etc. of a substrate). In some embodiments, property data 142 includes elemental analysis data (e.g., data that describes the elemental composition of a substrate). In some embodiments, property data 142 includes wafer signature data (e.g., data that describes distribution of wafer defects of a substrate originating from a single manufacturing problem). In some embodiments, property data 142 includes chip layer data (e.g., associated with a layer or operation in the substrate manufacturing process). In some embodiments, property data 142 includes chip layout data (e.g., data that describes the layout of a substrate is terms of planar geometric shapes). In some embodiments, property data 142 includes edge data (e.g., data that describes the edge of a wafer). For example, edge data may describe chipped edges, wafer edge thickness, wafer bow, wafer warp, etc. In some embodiments, property data 142 includes grey level data (e.g., data that describes the brightness of a pixel of an image of a substrate) and signal to noise data (e.g., data that describes the signal to noise ratio of a substrate measure with, for example, spectrometry equipment).

In some embodiments, the property data 142 (e.g., historical property data 144, current property data 146, etc.) is processed (e.g., by the client device 120 and/or by the predictive server 112). In some embodiments, processing of the property data 142 includes generating features. In some embodiments, the features are a pattern in the property data 142 (e.g., slope, width, height, peak, etc.) or a combination of values from the property data 142 (e.g., power derived from voltage and current, etc.). In some embodiments, the property data 142 includes features that are used by the predictive component 114 for obtaining predictive data 160.

In some embodiments, metrology equipment 128 can be included as part of the manufacturing equipment 124. For example, metrology equipment 128 can be included inside of or coupled to a processing chamber and configured to generate metrology data (e.g., property data 142, performance data 152, etc.) for the interior of a processing chamber or a substrate before, during, and/or after a process (e.g., a deposition process, an etch process, etc.) while the substrate remains in the processing chamber. In some instances, metrology equipment 128 can be referred to as in-situ metrology equipment. In another example, metrology equipment 128 can be coupled to another station of manufacturing equipment 124. For example, metrology equipment can be coupled to a transfer chamber, a load lock, or a factory interface.

In some embodiments, the metrology equipment 128 (e.g., ellipsometry equipment, imaging equipment, spectroscopy equipment, etc.) is used to determine metrology data (e.g., inspection data, image data, spectroscopy data, ellipsometry data, material compositional, optical, or structural data, etc.) corresponding to the interior (e.g., surfaces) of the processing chamber or to substrates produced by the manufacturing equipment 124 (e.g., substrate processing equipment). In some examples, after the manufacturing equipment 124 processes substrates, the metrology equipment 128 is used to inspect portions (e.g., layers) of the substrates. In some examples, after the manufacturing equipment 124 processes substrates, the sensors 126 are used to inspect portions of the interior of the processing chamber. In some embodiments, the metrology equipment 128 performs scanning acoustic microscopy (SAM), ultrasonic inspection, x-ray inspection, and/or computed tomography (CT) inspection. In some examples, after the manufacturing equipment 124 deposits one or more layers on a substrate, the metrology equipment 128 is used to determine quality of the processed substrate (e.g., thicknesses of the layers, uniformity of the layers, interlayer spacing of the layers, and/or the like). In some embodiments, the metrology equipment 128 includes an imaging device (e.g., SAM equipment, ultrasonic equipment, x-ray equipment, CT equipment, and/or the like). In some embodiments, property data 142 includes sensor data from sensors 126 and/or metrology data from metrology equipment 128.

In some embodiments, property data 142 includes sensor data from sensors 126 and/or metrology data from metrology equipment 128 located in-situ (inside the processing chamber). In some embodiments, performance data 152 includes user input via client device 120 and/or metrology data from metrology equipment 128. Property data 142 may include metrology data from a first subset of the metrology equipment 128 and performance data 152 may include metrology data from a second subset of the metrology equipment 128.

In some embodiments, the deposition thickness property data may be derived from metrology data and/or sensor data. Metrology data may be data describing metrology of a substrate. Sensor data may be data describing conditions and characteristics inside a processing chamber. In some embodiments, deposition thickness property data may include a deposition thickness value (e.g., an actual or expected amount of material deposited on the substrate). In some embodiments, deposition thickness property data may include a residual deposition thickness value (e.g., an actual or expected amount of material residually deposited on the chamber walls. In some embodiments, the deposition thickness value is derived from the deposition operation recipe (e.g., the deposition thickness is equal to the expected deposition thickness of the deposition operation).

In some embodiments, an actual deposition thickness value or an actual residual thickness value may refer to the amount of material actually deposited on a substrate or residually deposited on the process chamber walls following a deposition operation. The actual deposition thickness value or an actual residual thickness value may be measured using metrology equipment or sensors.

In some embodiments, an expected deposition thickness value or an expected residual thickness value may refer to the amount of material the is expected to be deposited on a substrate or residually deposited on the process chamber walls following a deposition operation. In some embodiments, the expected deposition thickness value or an actual residual thickness value may be derived from a process recipe (e.g., deposition operation parameters). In some embodiments, the expected deposition thickness value or an actual residual thickness value may be derived from historical actual deposition thickness values or an actual residual thickness values corresponding to the same deposition operation.

In some embodiments, the data store 140 is memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of property data 142, performance data 152, and/or predictive data 160.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In some embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In some embodiments, data store 140 can include multiple data stores where data that is inaccessible to the user is stored in one or more first data stores and data that is accessible to the user is stored in one or more second data stores.

Property data 142 includes historical property data 144 and current property data 146. In some embodiments, property data 142 (e.g., sensor data) may include temperature data, temperature range, power data, comparison parameters for comparing inspection data with threshold data, threshold data, cooling rate data, cooling rate range, and/or the like. In some embodiments, at least a portion of the property data 142 is from sensors 126 and/or metrology equipment 128.

Performance data 152 includes historical performance data 154 and current performance data 156. Performance data 152 may be indicative of whether a substrate is properly designed, is properly produced, has uniformity with the other substrates, and/or is properly functioning. Performance data 152 may be indicative of whether a substrate processing operation (e.g., semiconductor processing operation) is accurately carried out. For example, performance data 152 may be indicative of an actual thickness deposited (on the wafer or in the processing chamber) during a deposition operation. Performance data 152 may be indicative of whether a substrate processing operation (e.g., semiconductor processing operation, cleaning operation) is carried out effectively. For example, performance data 152 may be indicative of processing chamber cleanliness (e.g., deposition thickness on walls of the processing chamber) before, during, or after a cleaning operation and may indicate a deposition residual thickness, a cleaning agent (e.g., aluminum fluoride), residual particle count, etc.

In some embodiments, at least a portion of the performance data 152 is associated with a quality of substrates produced by the manufacturing equipment 124. In some embodiments, at least a portion of the performance data 152 is based on metrology data from the metrology equipment 128 (e.g., historical performance data 154 includes metrology data indicating properly processed substrates, property data of substrates, yield, etc.). In some embodiments, at least a portion of the performance data 152 is based on inspection of the substrates or interior of the processing chamber (e.g., current performance data 156 based on actual inspection). In some embodiments, performance data 152 includes user input (e.g., via client device 120) indicating a quality of the substrates or the cleanliness of a processing chamber/substrate processing areas. In some embodiments, the performance data 152 includes an indication of an absolute value (e.g., inspection data of the substrates indicates missing threshold data by a calculated value, deformation value misses the threshold deformation value by a calculated value) or a relative value (e.g., inspection data of the substrates indicates missing the threshold data by 5%, deformation misses threshold deformation by 5%, processing chamber cleanliness misses threshold cleanliness by 5%). In some embodiments, the performance data 152 is indicative of meeting a threshold amount of error (e.g., at least 5% error in processing chamber cleanliness following a clean operation, at least 5% error in production, at least 5% error in flow, at least 5% error in deformation, specification limit).

In some embodiments, historical data includes one or more of historical property data 144 and/or historical performance data 154 (e.g., at least a portion for training the machine learning model 190). Current data includes one or more of current property data 146 and/or current performance data 156 (e.g., at least a portion to be input into the trained machine learning model 190 subsequent to training the model 190 using the historical data). In some embodiments, the current data is used for retraining the trained machine learning model 190.

In some embodiments, the predictive data 160 is to be used to cause performance of corrective actions on the process recipes, cleaning operation parameters of clean recipes/operation, manufacturing equipment, substrate processing system, or substrate processing equipment parts.

Performing multiple types of metrology on multiple layers of products or processing chambers to determine whether to perform a corrective action is costly in terms of time used, metrology equipment 128 used, energy consumed, bandwidth used to send the metrology data, processor overhead to process the metrology data, etc. By providing property data 142 to model 190 and receiving predictive data 160 from the model 190, system 100 has the technical advantage of avoiding the costly process of using multiple types of metrology equipment 128 on multiple layers of products and processing chamber and to avoid wasting time and discarding substrates.

Performing manufacturing processes (e.g., depositions) with manufacturing equipment 124 and/or manufacturing parameters (e.g., cleaning operation parameters) that result in defective products or damaged manufacturing equipment is costly in time, energy, products, manufacturing equipment 124, the cost of identifying the corrective action to avoid causing the defective products, etc. By providing property data 142 to model 190, receiving predictive data 160 from the model 190, and causing a corrective action based on the predictive data 160, system 100 has the technical advantage of avoiding the cost of producing, identifying, and discarding defective substrates.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. The data set generator 172 has functions of data gathering, compilation, reduction, and/or partitioning to put the data in a form for machine learning. In some embodiments (e.g., for small datasets), partitioning (e.g., explicit partitioning) for post-training validation is not used. Repeated cross-validation (e.g., 5-fold cross-validation, leave-one-out-cross-validation) may be used during training where a given dataset is in-effect repeatedly partitioned into different training and validation sets during training. A model (e.g., the best model, the model with the highest accuracy, etc.) is chosen from vectors of models over automatically-separated combinatoric subsets. In some embodiments, the data set generator 172 may explicitly partition the historical data (e.g., historical property data 144 and corresponding historical performance data 154) into a training set (e.g., sixty percent of the historical data), a validating set (e.g., twenty percent of the historical data), and a testing set (e.g., twenty percent of the historical data). Some operations of data set generator 172 are described in detail below with respect to FIG. 2 according to some embodiments. In some embodiments, the predictive system 110 (e.g., via predictive component 114) generates multiple sets of features (e.g., training features). In some examples a first set of features corresponds to a first set of types of property data (e.g., from a first set of sensors, first combination of values from first set of sensors, first patterns in the values from the first set of sensors) that correspond to each of the data sets (e.g., training set, validation set, and testing set) and a second set of features correspond to a second set of types of property data (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general-purpose computer system, or a dedicated machine), firmware, microcode, or a combination thereof. The training engine 182 is capable of training a machine learning model 190 using one or more sets of features associated with the training set from data set generator 172. In some embodiments, the training engine 182 generates multiple trained machine learning models 190, where each trained machine learning model 190 corresponds to a distinct set of parameters of the training set (e.g., property data 142) and corresponding responses (e.g., performance data 152). In some embodiments, multiple models are trained on the same parameters with distinct targets for the purpose of modeling multiple effects. In some examples, a first trained machine learning model was trained using property data 142 from all sensors 126 (e.g., sensors 1-5), a second trained machine learning model was trained using a first subset of the property data (e.g., from sensors 1, 2, and 4), and a third trained machine learning model was trained using a second subset of the property data (e.g., from sensors 1, 3, 4, and 5) that partially overlaps the first subset of features.

The validation engine 184 is capable of validating a trained machine learning model 190 using a corresponding set of features of the validation set from data set generator 172. For example, a first trained machine learning model 190 that was trained using a first set of features of the training set is validated using the first set of features of the validation set. The validation engine 184 determines an accuracy of each of the trained machine learning models 190 based on the corresponding sets of features of the validation set. The validation engine 184 evaluates and flags (e.g., to be discarded) trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features of a testing set from data set generator 172. For example, a first trained machine learning model 190 that was trained using a first set of features of the training set is tested using the first set of features of the testing set. The testing engine 186 determines a trained machine learning model 190 that has the highest accuracy of all of the trained machine learning models based on the testing sets. In some embodiments, the machine learning model 190 (e.g., used for classification) refers to the model artifact that is created by the training engine 182 using a training set that includes data inputs and corresponding target outputs (e.g., correctly classifies a condition or ordinal level for respective training inputs). Patterns in the data sets can be found that map the data input to the target output (the correct classification or level), and the machine learning model 190 is provided mappings that captures these patterns. In some embodiments, the machine learning model 190 uses one or more of Gaussian Process Regression (GPR), Gaussian Process Classification (GPC), Bayesian Neural Networks, Neural Network Gaussian Processes, Deep Belief Network, Gaussian Mixture Model, or other Probabilistic Learning methods. Non probabilistic methods may also be used including one or more of Support Vector Machine (SVM), Radial Basis Function (RBF), clustering, Nearest Neighbor algorithm (k-NN), linear regression, random forest, neural network (e.g., artificial neural network), etc. In some embodiments, the machine learning model 190 is a multi-variate analysis (MVA) regression model.

Predictive component 114 provides current property data 146 (e.g., as input) to the trained machine learning model 190 and runs the trained machine learning model 190 (e.g., on the input to obtain one or more outputs). The predictive component 114 is capable of determining (e.g., extracting) predictive data 160 from the trained machine learning model 190 and determines (e.g., extracts) uncertainty data that indicates a level of credibility that the predictive data 160 corresponds to current performance data 156. In some embodiments, the predictive component 114 or corrective action component 122 use the uncertainty data (e.g., uncertainty function or acquisition function derived from uncertainty function) to decide whether to use the predictive data 160 to perform a corrective action or whether to further train the model 190.

Figure 2:
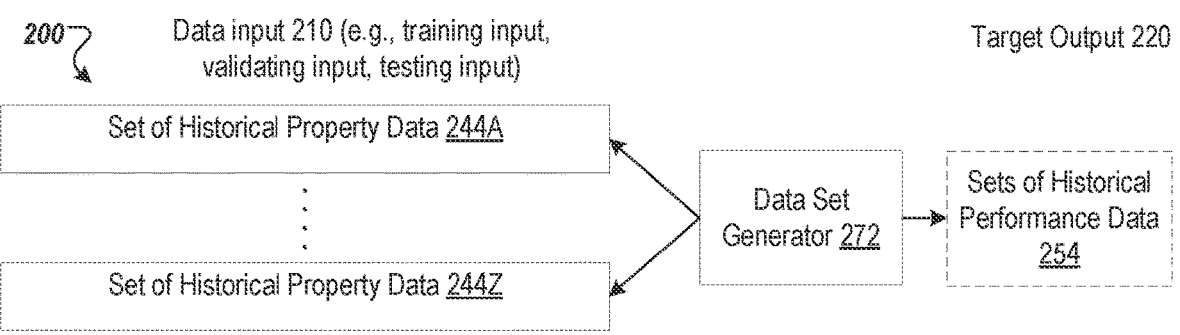
FIG. 2 illustrates a data set generator to create data sets for a machine learning model associated with cleaning operations based on deposition thickness, according to certain embodiments.

For purpose of illustration, rather than limitation, aspects of the disclosure describe the training of one or more machine learning models 190 using historical data (i.e., prior data, historical property data 144 and historical performance data 154) and providing current property data 146 into the one or more trained probabilistic machine learning models 190 to determine predictive data 160. In other implementations, a heuristic model or rule-based model is used to determine predictive data 160 (e.g., without using a trained machine learning model). In other implementations non-probabilistic machine learning models may be used. Predictive component 114 monitors historical property data 144 and historical performance data 154. In some embodiments, any of the information described with respect to data inputs 210 of FIG. 2 are monitored or otherwise used in the heuristic or rule-based model.

In some embodiments, the functions of client device 120, predictive server 112, server machine 170, and server machine 180 are to be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines corrective actions based on the predictive data 160. In another example, client device 120 determines the predictive data 160 based on data received from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a film can be deposited on a surface of a substrate and the surfaces of a processing chamber during a deposition process (e.g., a chemical-vapor deposition (CVD) process, an atomic layer deposition (ALD) process, and so forth) performed at the processing chamber of a manufacturing system. For example, in a CVD process, the substrate is exposed to one or more precursors, which react on the substrate surface to produce the desired deposit. The film is also deposited on the surfaces inside the processing chamber.

A manufacturing system can perform one or more processes on a substrate. A substrate can be any suitably rigid, fixed-dimension, planar article, such as, e.g., a silicon-containing disc or wafer, a patterned wafer, a glass plate, or the like, suitable for fabricating electronic devices or circuit components thereon.

Processing chambers can carry out any number of processes on substrate. A same or different substrate process can take place in each individual processing chamber. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Processing chambers can include one or more sensors configured to capture data for substrate before, after, or during a substrate process. For example, the one or more sensors can be configured to capture deposition thickness property data of either the substrate or the process chamber (e.g., chamber residual thickness). In other or similar embodiments, the one or more sensors can be configured to capture data associated with the environment within processing chamber before, after, or during the substrate process. For example, the one or more sensors can be configured to capture data associated with a temperature, a pressure, a gas concentration, particle count (e.g., cleaning agent particle count) etc. of the environment within the processing chamber during the substrate process.

In some embodiments, a sensor may not be used to capture the deposition thickness property data or either the substrate or the process chamber. In some embodiments, the deposition thickness property is determined based on the deposition operation or deposition recipe parameters. For example, a deposition operation may be configured to deposit 30 angstroms of film and the deposition thickness property data is derived from such deposition operation parameters.

A processing chamber can be used for processes in which a corrosive plasma environment is provided. For example, the processing chamber can be a chamber for a plasma etcher or plasma etch reactor, and so forth. In another example, processing chamber can be a chamber for a deposition process, as previously described. The chamber body can be fabricated from aluminum, stainless steel or other suitable material such as titanium (Ti). The chamber body generally includes sidewalls and a bottom (e.g., processing chamber surfaces).

In some embodiments, a processing chamber can include metrology equipment configured to generate in-situ metrology measurements during a process performed at processing chamber (e.g., deposition process). In some embodiments, the metrology equipment can be configured to generate a metrology measurement value (e.g., a thickness) for a film or deposition residue during particular instances of the deposition process. In other or similar embodiments, processing chamber may not include metrology equipment. In such embodiments, the system controller can receive one or more metrology measurement values for film a film or deposition residue after completion of the deposition process at a processing chamber. In some embodiments, the deposition residue thickness may be equal to the thickness of the material deposited. System controller can determine a deposition rate based on the one or more metrology measurement values and can associate generate the thickness profile for a film or deposition residue thickness based on the determined concentration gradient and the determined deposition rate of the deposition process.

In some embodiments, a processing chamber can include sensors configured to generate in-situ sensor data before, during, and/or after a process performed at processing chamber (e.g., deposition process). In some embodiments, the sensors can be configured to generate a sensor data value (e.g., a thickness) for a film or deposition residue during particular instances of the deposition process. In other or similar embodiments, processing chamber may not include sensors. In such embodiments, the system controller can instead receive one or more metrology measurement values for film a film or deposition residue after completion of the deposition process at a processing chamber. In some embodiments, the deposition residue thickness may be equal to the thickness of the material deposited. The system controller can determine a deposition rate based on the one or more sensor data values and can associate generate the thickness profile for a film or deposition residue thickness based on the determined concentration gradient and the determined deposition rate of the deposition process.

A processing chamber can perform each substrate manufacturing process (e.g., the deposition process, the etch process, the polishing process, etc.) according to a process recipe. A process recipe defines a particular set of operations, including cleaning operations, to be performed during the process and can include one or more settings or parameters associated with each operation. For example, a cleaning operation can include a quantity of clean time setting, a temperature setting for the processing chamber, a pressure setting for the processing chamber, an intensity of clean setting, etc.

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of determining predictive data 160 for cleaning operations based on deposition thickness associated with substrate processing in manufacturing facilities (e.g., substrate processing facilities), in some embodiments, the disclosure can also be generally applied to corrective actions in manufacturing facilities. Embodiments can be generally applied to determining quality of parts based on different types of data.

FIG. 2 illustrates a data set generator 272 (e.g., data set generator 172 of FIG. 1) to create data sets for a machine learning model (e.g., associated with cleaning operations based on deposition thickness, methods 400A-C, etc.) (e.g., model 190 of FIG. 1), according to certain embodiments. In some embodiments, data set generator 272 is part of server machine 170 of FIG. 1. The data sets generated by data set generator 272 of FIG. 2 may be used to train a machine learning model (e.g., see FIG. 4B) to cause performance of a corrective action (e.g., see FIG. 4C).

Data set generator 272 (e.g., data set generator 172 of FIG. 1) creates data sets for a machine learning model (e.g., model 190 of FIG. 1). Data set generator 272 creates data sets using historical property data 244 (e.g., historical property data 144 of FIG. 1) and historical performance data 254 (e.g., historical performance data 154 of FIG. 1). System 200 of FIG. 2 illustrates data set generator 272, data inputs 210, and target output 220 (e.g., target data).

In some embodiments, data set generator 272 generates a data set (e.g., training set, validating set, testing set) that includes one or more data inputs 210 (e.g., training input, validating input, testing input). In some embodiments, data set generator 272 does not generate target output (e.g., for unsupervised learning). In some embodiments, data set generator generates one or more target outputs 220 (e.g., for supervised learning) that correspond to the data inputs 210. The data set may also include mapping data that maps the data inputs 210 to the target outputs 220. Data inputs 210 are also referred to as "features," "attributes," or "information." In some embodiments, data set generator 272 provides the data set to the training engine 182, validation engine 184, or testing engine 186, where the data set is used to train, validate, or test the machine learning model 190 (e.g., associated with cleaning operations based on deposition thickness, methods 400A-C, etc.).

In some embodiments, data set generator 272 generates the data input 210 and target output 220. In some embodiments, data inputs 210 include one or more sets of historical property data 244 (e.g., associated with cleaning operations based on deposition thickness, methods 400A-C, etc.). In some embodiments, historical property data 244 includes one or more of property data from one or more types of sensors and/or metrology equipment, combination of property data from one or more types of sensors and/or metrology equipment, patterns from property data from one or more types of sensors and/or metrology equipment, and/or the like.

In some embodiments, data set generator 272 generates a first data input corresponding to a first set of historical property data 244A to train, validate, or test a first machine learning model and the data set generator 272 generates a second data input corresponding to a second set of historical property data 244B to train, validate, or test a second machine learning model (e.g., associated with cleaning operations based on deposition thickness, methods 400A-C, etc.).

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical property data 144 to obtain a target output 220 (e.g., discrete historical performance data 154 associated with cleaning operations based on deposition thickness, methods 400A-C, etc.).

Data inputs 210 and target outputs 220 to train, validate, or test a machine learning model include information for a particular facility (e.g., for a particular substrate manufacturing facility). In some examples, historical property data 244 and historical performance data 254 are for the same manufacturing facility (e.g., associated with cleaning operations based on deposition thickness, methods 400A-C, etc.).

In some embodiments, the information used to train the machine learning model is from specific types of manufacturing equipment 124 of the manufacturing facility having specific characteristics and allows the trained machine learning model (e.g., associated with cleaning operations based on deposition thickness, methods 400A-C, etc.) to determine outcomes for a specific group of manufacturing equipment 124 based on input for current parameters (e.g., current property data 146) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 (e.g., associated with cleaning operations based on deposition thickness, methods 400A-C, etc.) using the data set, the machine learning model 190 is further trained, validated, or tested (e.g., current performance data 156 of FIG. 1) or adjusted (e.g., adjusting weights associated with input data of the machine learning model 190, such as connection weights in a neural network).

The machine learning model processes the input to generate an output (e.g., associated with cleaning operations based on deposition thickness, methods 400A-C, etc.). An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine learning model can produce.

Accordingly, the output can include one or more predictions or inferences (e.g., associated with cleaning operations based on deposition thickness, methods 400A-C, etc.). For example, an output prediction or inference can include one or more predictions of film buildup on chamber components, processing chamber cleanliness, residual deposition thickness following a cleaning operation, erosion of chamber components, predicted failure of chamber components, and so on. Processing logic determines an error (i.e., a classification error) based on the differences between the output (e.g., predictions or inferences) of the machine learning model and target labels associated with the input training data. Processing logic adjusts weights of one or more nodes in the machine learning model based on the error. An error term or delta can be determined for each node in the artificial neural network. Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy can be, for example, 70%, 80% or 90% accuracy. In one embodiment, the stopping criterion is met if accuracy of the machine learning model has stopped improving. If the stopping criterion has not been met, further training is performed. If the stopping criterion has been met, training can be complete. Once the machine learning model is trained, a reserved portion of the training dataset can be used to test the model.

Figure 3:
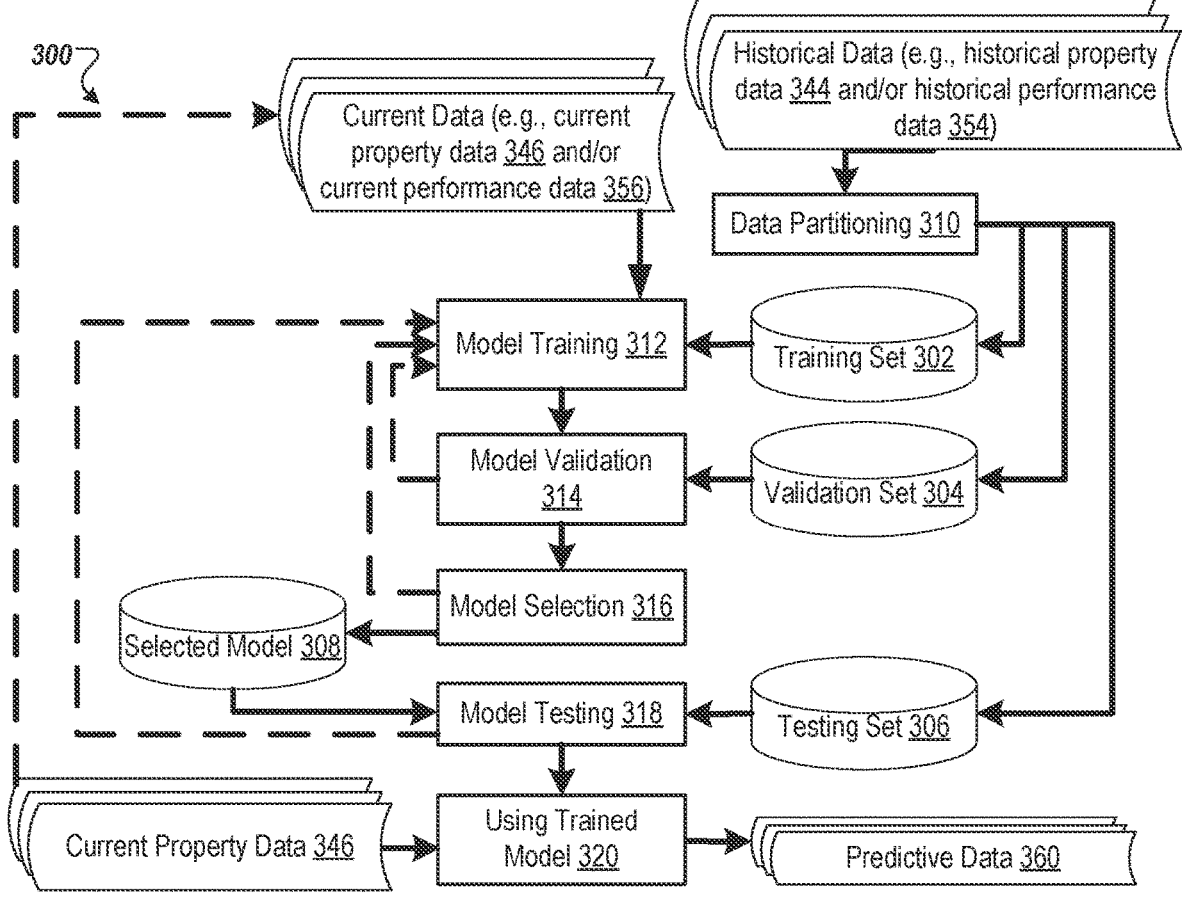
FIG. 3 is a block diagram illustrating determining predictive data associated with cleaning operations based on deposition thickness, according to certain embodiments.

FIG. 3 is a block diagram illustrating a system 300 for generating predictive data 360 (e.g., predictive data 160 of FIG. 1), according to certain embodiments. The system 300 is used to determine predictive data 360 via a trained machine learning model (e.g., model 190 of FIG. 1) for deposition thickness based cleans (e.g., optimized chamber cleans by utilizing deposition thickness counters).

At block 310, the system 300 (e.g., predictive system 110 of FIG. 1) performs data partitioning (e.g., via data set generator 172 of server machine 170 of FIG. 1) of the historical data (e.g., historical property data 344 and/or historical performance data 354 for model 190 of FIG. 1) to generate the training set 302, validation set 304, and testing set 306 (e.g., associated with cleaning operations based on deposition thickness, methods 400A-C, etc.). In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from 20 sensors (e.g., sensors 126 of FIG. 1, sensors of manufacturing equipment and/or metrology equipment) and 100 products (e.g., products that each correspond to property data from the 20 sensors), a first set of features is sensors 1-10, a second set of features is sensors 11-20, the training set is products 1-60, the validation set is products 61-80, and the testing set is products 81-100. In this example, the first set of features of the training set would be parameters from sensors 1-10 for products 1-60.

At block 312, the system 300 performs model training (e.g., via training engine 182 of FIG. 1 associated with cleaning operations based on deposition thickness, methods 400A-C, etc.) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., property data from sensors 1-10 for products 1-60) and to generate a second trained machine learning model using the second set of features in the training set (e.g., property data from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features are used in comparing models overlap (e.g., first set of features being property data from sensors 1-15 and second set of features being property data from sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models (e.g., associated with cleaning operations based on deposition thickness, methods 400A-C, etc.) using a corresponding set of features of the validation set 304. For example, system 300 validates the first trained machine learning model using the first set of features in the validation set (e.g., parameters from sensors 1-10 for products 61-80) and the second trained machine learning model using the second set of features in the validation set (e.g., parameters from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., property data from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., property data from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions (e.g., associated with cleaning operations based on deposition thickness, methods 400A-C, etc.).

At block 320, system 300 uses the trained model (e.g., selected model 308) to receive current property data 346 (e.g., current property data 146 of FIG. 1) and determines (e.g., extracts), from the trained model, predictive data 360 (e.g., predictive data 160 of FIG. 1) for cleaning operations based on deposition thickness to perform a corrective action (e.g., causing modification of cleaning operation parameters, clean recipes, process recipes, etc.). In some embodiments, the current property data 346 corresponds to the same types of features in the historical property data 344. In some embodiments, the current property data 346 corresponds to a same type of features as a subset of the types of features in historical property data 344 that is used to train the selected model 308 (e.g., associated with cleaning operations based on deposition thickness, methods 400A-C, etc.).

In some embodiments, current data is received. In some embodiments, current data includes current performance data 356 (e.g., current performance data 156 of FIG. 1) and/or current property data 346 (e.g., associated with cleaning operations based on deposition thickness, methods 400A-C, etc.). In some embodiments, at least a portion of the current data is received from metrology equipment (e.g., metrology equipment 128 of FIG. 1) or via user input. In some embodiments, the model is re-trained based on the current data. In some embodiments, a new model is trained based on the current performance data 356 and the current property data 346.

In some embodiments, one or more of the blocks 310-320 occur in various orders and/or with other operations not presented and described herein. In some embodiments, one or more of blocks 310-320 are not to be performed. For example, in some embodiments, one or more of data partitioning of block 310, model validation of block 314, model selection of block 316, and/or model testing of block 318 are not to be performed.

Figure 4B:
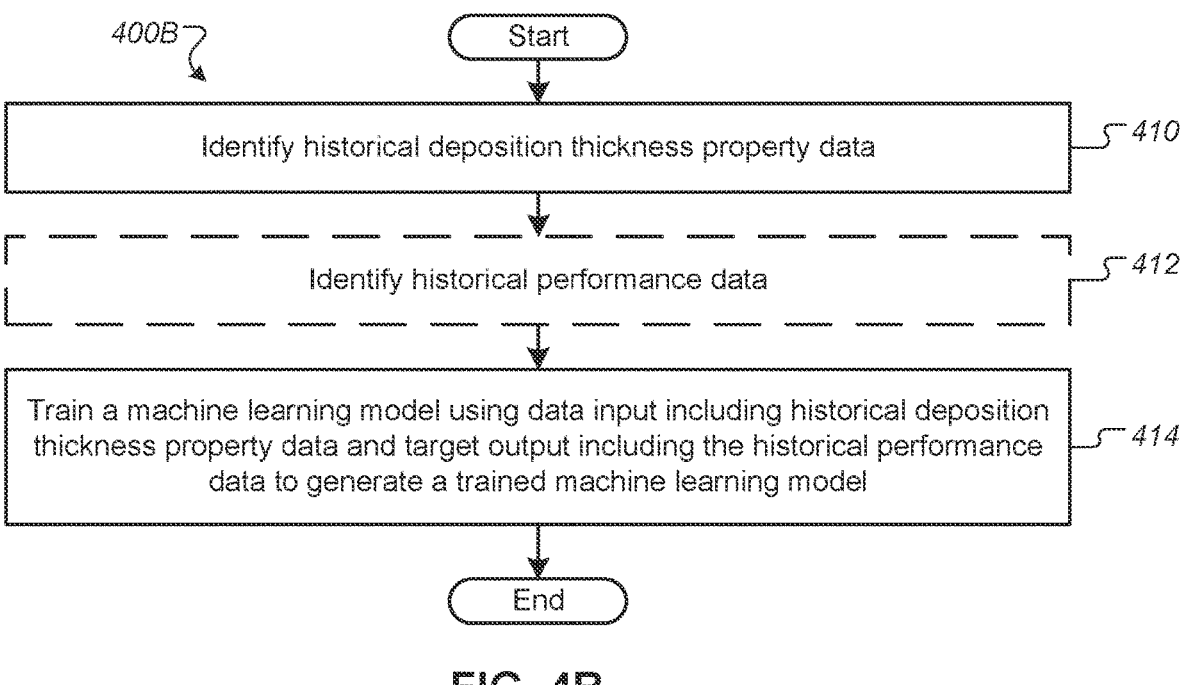
Figure 4C:
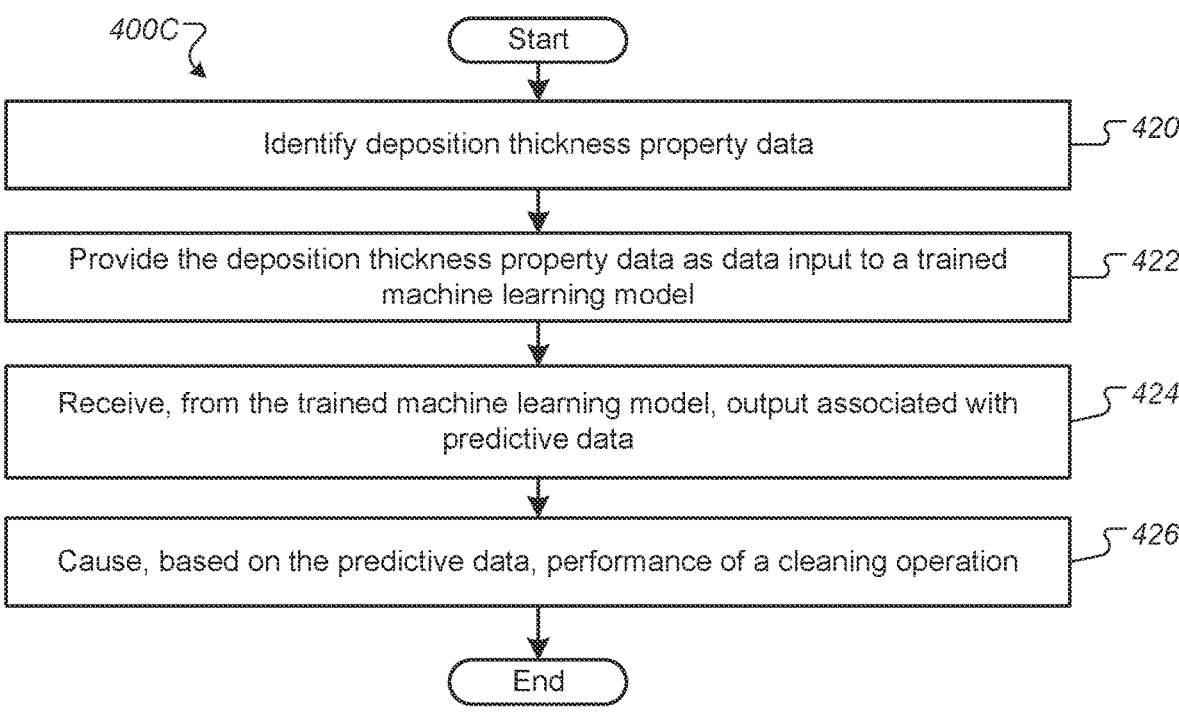

FIGS. 4A-C are flow diagrams of methods 400A-C associated with deposition thickness based cleans, according to certain embodiments. In some embodiments, methods 400A-C are performed by processing logic that includes hardware (e.g., circuitry, dedicated logic, programmable logic, microcode, processing device, etc.), software (such as instructions run on a processing device, a general-purpose computer system, or a dedicated machine), firmware, microcode, or a combination thereof. In one implementation, method 400A can be performed by a computer system, such as computer system architecture 100 of FIG. 1. In other or similar implementations, one or more operations of method 400A can be performed by one or more other machines not depicted in the figures. In some embodiments, methods 400A-C are performed, at least in part, by predictive system 110. In some embodiments, method 400A is performed by client device 120 (e.g., corrective action component 122) and/or predictive system 110 (e.g., predictive component). In some embodiments, method 400B is performed by server machine 180 (e.g., training engine 182, etc.). In some embodiments, method 400C is performed by predictive server 112 (e.g., predictive component 114) and/or client device 120 (e.g., corrective action component 122). In some embodiments, a non-transitory storage medium stores instructions that when executed by a processing device (e.g., of predictive system 110, of server machine 180, of predictive server 112, of client device 120, etc.), cause the processing device to perform one or more of methods 400A-C.

For simplicity of explanation, methods 400A-C are depicted and described as a series of operations. However, operations in accordance with this disclosure can occur in various orders and/or concurrently and with other operations not presented and described herein. Furthermore, in some embodiments, not all illustrated operations are performed to implement methods 400A-C in accordance with the disclosed subject matter. In addition, those skilled in the art will understand and appreciate that methods 400A-C could alternatively be represented as a series of interrelated states via a state diagram or events.

FIG. 4A is a flow diagram of a method associated with deposition thickness based cleans, according to aspects of the present disclosure.

Referring to FIG. 4A, in some embodiments, at block 402 the processing logic implementing the method 400A identifies deposition thickness property data associated with an amount of material deposited via one or more substrate processing operations (e.g., semiconductor processing operations) of a process recipe performed in a processing chamber. In some embodiments, the processing logic may identify the deposition thickness property data by way of a sensor that collects the deposition thickness property data (e.g., by measuring the deposition residual thickness on the processing chamber walls). In some embodiments, the processing logic may identify the deposition thickness property data based on an expected thickness added to the substrate (e.g., semiconductor) (e.g., a thickness parameter of a deposition operation, a measured thickness from a previous run of the same deposition operation, etc.). In some embodiments, the processing logic may identify the deposition thickness property data based on the material deposited and the amount of time it is deposited (e.g., a process recipe, deposition operation parameters, etc.). In some embodiments, the processing logic may identify the deposition thickness property data based on metrology data of a substrate (e.g., semiconductor) that underwent a substrate processing operation (e.g., deposition operation, semiconductor processing operation).

At block 404, the processing logic determines, based on the deposition thickness property data and a variable clean time relationship of the process recipe, cleaning operation parameters (e.g., duration, intensity, cleaning agent, type of clean, number of cycles, etc.). In some embodiments, the processing logic can generate updated cleaning operation parameters using one or more formulas or mathematical models. In some embodiments, the variable clean time relationship is a mathematical relationship, equation, function, and/or the like. In some embodiments, the input of the equation or function is the deposition thickness (e.g., deposition thickness counter) and the output of the equation is cleaning operation parameters (e.g., clean time duration).

In some embodiments, for example, the mathematical equation may be a polynomial equation with an order of three and can be expressed as: $y=ax^3+bx^2+cx+d$, where (x, y) are coordinates and a, b, c, and d are constants. The polynomial equation having an order of three is used by way of example, and a polynomial equation of any order can be used. In some embodiments, and 'x' is replaced by the current value of the deposition thickness counter for the slot running the recipe. For example, if a deposition thickness counter is equal to 10 angstroms, then 10 will be plugged into the above equation as the 'x' value and the resulting output will be the variable clean time.

In some embodiments, a clean time endpoint may be determined using an input equation (e.g., variable clean time relationship). In some embodiments, when a clean time endpoint is used in an operation, the operation will run for the amount of time calculated based on the input equation. The equation may be applied for each substrate processing area in a processing chamber.

At block 406, the processing logic causes, based on the cleaning operation parameters, a cleaning operation in the processing chamber. In some embodiments, the cleaning operation may be a dry clean (e.g., gas phase clean, fluorine-containing gas clean, plasma dry clean, oxygen plasma clean, etc.). In some embodiments, the cleaning operation may be a wet clean (e.g., hydro fluoride (HF) clean, acetone/water/isopropanol wipe down clean, etc.)

In some embodiments, the cleaning operation of block 406 may over-clean or under-clean the processing chamber. In some embodiments, performance data associated with the cleaning operation may identified following block 406. In some embodiments, certain parts of method 400A may be updated (e.g., update deposition thickness property data associated the amount of material deposited via the one or more substrate processing operations (e.g., semiconductor processing operations), update the variable clean time relationship, update the cleaning operation parameters, etc.), based on the performance data. In some embodiments, updated method 400A may be repeated to carry out the cleaning operation more accurately.

In some embodiments, the deposition thickness property data may include at least one of a type of material or a thickness counter. In some embodiments, the processing logic may further reset the thickness counter after the cleaning operation is performed. In some embodiments, the cleaning operation parameters may include a quantity of clean time. In some embodiments, a thickness counter is the expected deposition thickness based on a deposition process and the number of times that process is repeated. For example, a deposition operation may be expected to deposit 20 angstroms of film. After a first iteration of the deposition operation the deposition thickness counter is equal to 20 angstroms. After a second iteration of the deposition operation the deposition thickness counter is equal to 40 angstroms, and so on.

In some embodiments, the processing chamber may include substrate processing areas. In some embodiments, the determining of the cleaning operation parameters may be based on the deposition thickness property data of at least one of the substrate processing areas and the variable clean time relationship of the process recipe.

In some embodiments, the determining of the cleaning operation parameters may include providing the deposition thickness property data as input to a trained machine learning model associated with the variable clean time relationship and receiving, from the trained machine learning model, output associated with predictive data, wherein the cleaning operation parameters are based on the predictive data. In some embodiments, the trained machine learning model may be trained using data input including historical deposition thickness property data and target output including historical performance data.

FIG. 4B is a flow diagram of a method for training a machine learning model (e.g., model 190 of FIG. 1) for determining predictive data (e.g., predictive data 160 of FIG. 1) associated with cleaning operations based on deposition thickness, according to aspects of the present disclosure.

Referring to FIG. 4B, at block 410 of method 400B, the processing logic identifies historical deposition thickness property data of substrates (e.g., historical property data 144 of FIG. 1). Historical property data may include data from historical substrates, historical processing chamber property data, and/or the like.

In some embodiments, at block 412, the processing logic identifies historical performance data (e.g., historical performance data 154 of FIG. 1) of the substrates, processing chambers (e.g., processing chamber cleanliness), process recipes, cleaning operation parameters, and/or the like. Historical performance data may include data from historical processing chambers such as values of one or more of cleanliness, deposition residue thickness, particle count, and/or the like (e.g., subsequent to a cleaning operation). Performance data, including historical performance data, may include metrology data or user input that indicates the performance of a substrate in conforming to certain parameters or achieving certain levels of performance (e.g., ability to pass probe tests measuring voltage). Performance data, including historical performance data, may include metrology data or user input that indicates the performance of a processing chamber in meeting certain parameters or achieving certain levels of performance (e.g., ability to pass cleanliness tests). At least a portion of the historical property data and the historical performance data may be associated with new substrate processing equipment parts (e.g., used for benchmarking). At least a portion of the historical property data and the historical performance data may be associated with manufactured substrates. At least a portion of the historical property data and the historical performance data may be associated with processing chambers.

At block 414, the processing logic trains a machine learning model using data input including historical property data 144 and/or target output including the historical performance data 154 to generate a trained machine learning model.

In some embodiments, the historical property data is of historical substrates or processing chambers and/or the historical performance data corresponds to the historical substrates or processing chambers. In some embodiments, the historical property data includes historical metrology of historical substrates or processing chambers and/or the historical performance data corresponds to the historical substrates or processing chambers. The historical performance data may be associated with substrate quality, such as metrology data of substrates, substrate throughput, substrate defects, etc. The historical performance data may be associated with quality of processing chambers, such as cleanliness. The historical performance data may be associated with quality of a process recipe or cleaning operation parameters, such as ability to properly clean a processing chamber following a deposition operation. The historical performance data may be associated with quality of a substrate processing equipment part, such as test data, metrology data of the substrates, time of failure of substrates, etc.

At block 414, the machine learning model may be trained using historical deposition thickness property data and/or target output including the historical performance data to generate a trained machine learning model configured to determine cleaning operation parameters and cause a cleaning operation based on property data (e.g., property data of block 402 of FIG. 4A). In some embodiments, the trained machine learning model may be configured to predict performance data 152 (e.g., performance data of the updated process recipe, updated cleaning operation parameters, etc.)

based on property data 142 (e.g., deposition thickness property data of blocks 402 and 404 of FIG. 4A). Responsive to the predicted performance data meeting a first threshold (e.g., processing chamber over cleaned), the processing logic may cause a corrective action (e.g., updating cleaning operation parameters, updating process recipe, etc.). Responsive to the predicted performance data meeting a second threshold (e.g., processing chamber under cleaned), the processing logic may cause a corrective action (e.g., updating cleaning operation parameters, updating process recipe, etc.). Responsive to the predicted performance data meeting both the first and second threshold values, the process logic may cause a corrective action to not take place (e.g., cause process recipe to remain the same, cause cleaning operation parameters to remain the same, etc.).

In some embodiments, the historical deposition thickness property data of block 410 is of historical substrates and/or historical processing chambers and the historical performance data of block 412 corresponds to the historical substrates and/or historical processing chambers. In some embodiments, the historical property data of block 410 is associated with processing of historical substrates and the historical performance data of block 412 corresponds to historical cleaning operations subsequent to the processing of historical substrates.

FIG. 4C is a method 400C for using a trained machine learning model (e.g., model 190 of FIG. 1) for deposition thickness based cleans and to cause performance of a cleaning operation.

Referring to FIG. 4C, at block 420 of method 400C, the processing logic identifies deposition thickness property data. In some embodiments, the deposition thickness property data of block 420 includes deposition residual thickness, deposition thickness counters, etc. In some embodiments, block 420 is similar to block 402 of FIG. 4A.

At block 422, the processing logic provides the deposition thickness property data as data input to a trained machine learning model (e.g., trained via block 414 of FIG. 4B) associated with the variable clean time relationship.

At block 424, the processing logic receives, from the trained machine learning model, output associated with predictive data, where the cleaning operation parameters are based on the predictive data.

At block 426, the processing logic causes, based on the predictive data, performance of a cleaning operation in the processing chamber. In some embodiments, the property data 142 is an image of a substrate and the trained machine learning model of block 422 was trained using data input including historical deposition thickness property data of historical substrates and historical deposition operations, and target output including historical performance data 154 (e.g., substrate quality using historical substrate processing equipment parts, processing chamber cleanliness, etc.).

In some embodiments, block 402 of FIG. 4A includes training a machine learning model (e.g., using data input including historical property data 144 and/or target output including the historical performance data 154 to generate a trained machine learning model) to identify deposition thickness property data associated with an amount of material deposited via one or more substrate processing operations (e.g., semiconductor processing operations) of a process recipe performed in a processing chamber. In some embodiments, block 402 of FIG. 4A includes using the trained machine learning model (e.g., using data input including deposition thickness property data and/or target output including deposition thickness property data) to identify deposition thickness property data associated with an amount of material deposited via one or more substrate processing operations (e.g., semiconductor processing operations) of a process recipe performed in a processing chamber.

In some embodiments, block 404 of FIG. 4A includes training a machine learning model (e.g., using data input including historical property data 144 and/or target output including the historical performance data 154 to generate a trained machine learning model) to determine, based on the deposition thickness property data and a variable clean time relationship of the process recipe, cleaning operation parameters. In some embodiments, block 402 of FIG. 4A includes using the trained machine learning model (e.g., using data input including deposition thickness property data and/or target output including cleaning operation parameters) to determine, based on the deposition thickness property data and a variable clean time relationship of the process recipe, cleaning operation parameters.

In some embodiments, the property data 142 is an expected or actual deposition thickness property data (e.g., an expected or an actual deposition thickness associated with a deposition process) and the trained machine learning model of block 422 was trained using data input including historical expected deposition thickness or historical actual deposition thickness and target output including historical performance data 154 (e.g., substrate quality using historical substrate processing equipment parts or processing chamber cleanliness). In some embodiments, processing chamber cleanliness may be indicative of a processing chamber being over-cleaned or under-cleaned.

In some embodiments, the property data 142 is deposition thickness property data and the trained machine learning model of block 422 was trained using data input including historical deposition thickness property data and target output including historical performance data 154 that includes historical sensor data (e.g., deposition residual thickness of processing chambers following historical deposition operations). The predictive data 160 of block 424 may be associated with predicted performance data (e.g., performance data of the substrate or performance data of a cleaning recipe or operation) based on deposition thickness property data. Responsive to the predicted performance data not meeting a first threshold (e.g., processing chamber over cleaned), the processing logic may cause a corrective action (e.g., update process recipe, update cleaning operation parameters, etc.). Responsive to the predicted performance data not meeting a second threshold (e.g., processing chamber under cleaned), the processing logic may cause a corrective action (e.g., update process recipe, update cleaning operation parameters, etc.). Responsive to a substrate meeting both the first and second threshold values, the process logic may cause a corrective action to not take place (e.g., cause process recipe to remain the same, cause cleaning operation parameters to remain the same, etc.).

In some embodiments, a threshold value may correspond to the processing chamber being under-cleaned. For example, a first threshold value may correspond to a residual deposition thickness being less than a certain value (e.g., 1 angstrom). In some embodiments, meeting the first threshold value may correspond to the process chamber being sufficiently cleaned and not meeting the first threshold value corresponds to the processing chamber being under-cleaned. In some embodiments, a threshold value may correspond to the processing chamber being over-cleaned. For example, a second threshold value may correspond to a particle count (e.g., cleaning agent particles) being less than a certain value. In some embodiments, meeting the second threshold value may correspond to the process chamber being sufficiently cleaned and not meeting the first threshold value corresponds to the processing chamber being over-cleaned.

Figure 5:
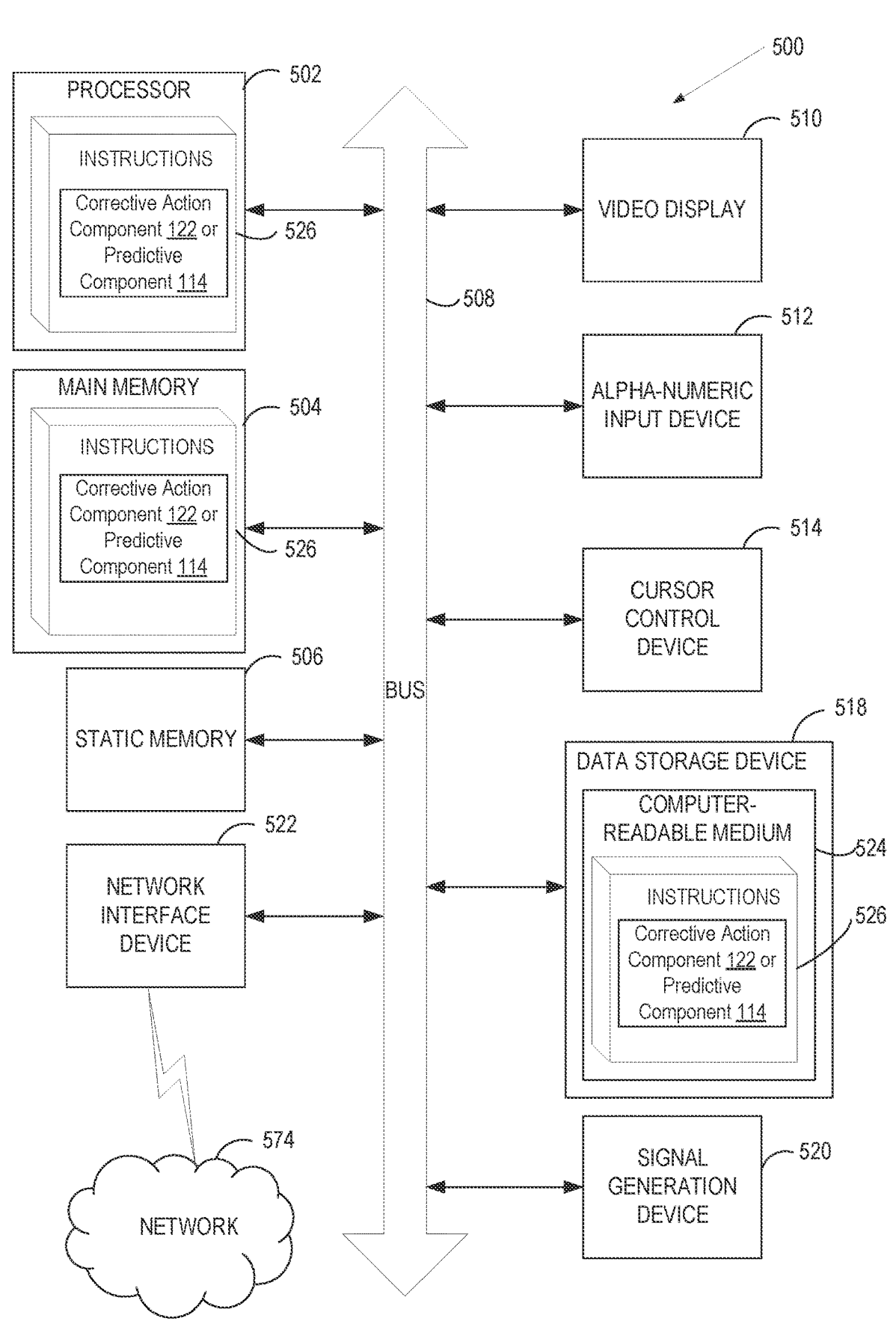
FIG. 5 is a block diagram illustrating a computer system, according to certain embodiments.

FIG. 5 is a block diagram illustrating a computer system 500, according to certain embodiments. In some embodiments, the computer system 500 is one or more of client device 120, predictive system 110, server machine 170, server machine 180, predictive server 112, and/or the like.

In some embodiments, computer system 500 is connected (e.g., via a network, such as a Local Area Network (LAN), an intranet, an extranet, or the Internet) to other computer systems. In some embodiments, computer system 500 operates in the capacity of a server or a client computer in a client-server environment, or as a peer computer in a peer-to-peer or distributed network environment. In some embodiments, computer system 500 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 500 includes a processing device 502, a volatile memory 504 (e.g., Random Access Memory (RAM)), a non-volatile memory 506 (e.g., Read-Only Memory (ROM) or Electrically-Erasable Programmable ROM (EEPROM)), and a data storage device 518, which communicate with each other via a bus 508.

In some embodiments, processing device 502 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 500 further includes a network interface device 522 (e.g., coupled to network 574). In some embodiments, computer system 500 also includes a video display unit 510 (e.g., a liquid crystal display (LCD)), an alphanumeric input device 512 (e.g., a keyboard), a cursor control device 514 (e.g., a mouse), and a signal generation device 520.

In some implementations, data storage device 518 includes a non-transitory computer-readable storage medium 524 on which store instructions 526 encoding any one or more of the methods or functions described herein, including instructions encoding components of FIG. 1 (e.g., corrective action component 122, predictive component 114, etc.) and for implementing methods described herein (e.g., one or more of methods 400A-C).

In some embodiments, instructions 526 also reside, completely or partially, within volatile memory 504 and/or within processing device 502 during execution thereof by computer system 500, hence, in some embodiments, volatile memory 504 and processing device 502 also constitute machine-readable storage media.

While computer-readable storage medium 524 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as application specific integrated circuits (ASICS), FPGAS, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "identifying," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and cannot have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   identifying deposition thickness property data associated with an amount of material deposited via one or more semiconductor processing operations of a process recipe performed in a processing chamber;

providing the deposition thickness property data as input to a variable cleaning relationship of the process recipe to determine cleaning operation parameters comprising two or more of cleaning intensity, cleaning temperature, or cleaning cycle quantity in the processing chamber, wherein the variable cleaning relationship comprises a function that outputs the cleaning operation parameters based on a current value of the deposition thickness property data; and
   causing, based on the cleaning operation parameters, a cleaning operation in the processing chamber.

2. The method of claim 1, wherein the deposition thickness property data comprises a deposition thickness counter that accumulates deposition thickness values from multiple semiconductor processing operations.

3. The method of claim 2, further comprising resetting the deposition thickness counter after the cleaning operation is performed.

4. The method of claim 1, wherein the cleaning operation parameters further comprise a quantity of clean time.

5. The method of claim 1, wherein:
   the processing chamber comprises a plurality of substrate processing areas; and
   determining the cleaning operation parameters is based on the deposition thickness property data of at least one of the plurality of substrate processing areas and the variable cleaning relationship of the process recipe.

6. The method of claim 1, wherein the providing of of the deposition thickness property data as the input to the variable cleaning relationship to determine the cleaning operation parameters comprises:
   providing the deposition thickness property data as the input to a trained machine learning model associated with the variable cleaning relationship; and
   receiving, from the trained machine learning model, output associated with predictive data, wherein the cleaning operation parameters are based on the predictive data.

7. The method of claim 6, wherein the trained machine learning model is trained using data input comprising historical deposition thickness property data and target output comprising historical performance data.

8. A non-transitory computer-readable storage medium storing instructions which, when executed, cause a processing device to perform operations comprising:
   identifying deposition thickness property data associated with an amount of material deposited via one or more substrate processing operations of a process recipe performed in a processing chamber;
   providing the deposition thickness property data as input to a variable cleaning relationship of the process recipe to determine cleaning operation parameters comprising two or more of cleaning intensity, cleaning temperature, or cleaning cycle quantity in the processing chamber, wherein the variable cleaning relationship comprises a function that outputs the cleaning operation parameters based on a current value of the deposition thickness property data; and
   causing, based on the cleaning operation parameters, a cleaning operation in the processing chamber.

9. The non-transitory computer-readable storage medium of claim 8, wherein the deposition thickness property data comprises a deposition thickness counter that accumulates deposition thickness values from multiple semiconductor processing operations.

10. The non-transitory computer-readable storage medium of claim 9, the operations further comprising resetting the deposition thickness counter after the cleaning operation is performed.

11. The non-transitory computer-readable storage medium of claim 8, wherein the cleaning operation parameters further comprise a quantity of clean time.

12. The non-transitory computer-readable storage medium of claim 8, wherein the processing chamber comprises a plurality of substrate processing areas, and wherein determining the cleaning operation parameters is based on the deposition thickness property data of at least one of the plurality of substrate processing areas and the variable cleaning relationship of the process recipe.

13. The non-transitory computer-readable storage medium of claim 8, wherein the providing of of the deposition thickness property data as the input to the variable cleaning relationship to determine the cleaning operation parameters comprises:

providing the deposition thickness property data as the input to a trained machine learning model associated with the variable cleaning relationship; and receiving, from the trained machine learning model, output associated with predictive data, wherein the cleaning operation parameters are based on the predictive data.

14. The non-transitory computer-readable storage medium of claim 13, wherein the trained machine learning model is trained using data input comprising historical deposition thickness property data and target output comprising historical performance data.

15. A system comprising:

a memory; and a processing device coupled to the memory, the processing device to:

identify deposition thickness property data associated with an amount of material deposited via one or more substrate processing operations of a process recipe performed in a processing chamber;

provide the deposition thickness property data as input to a variable cleaning relationship of the process recipe to determine cleaning operation parameters comprising two or more of cleaning intensity, cleaning temperature, or cleaning cycle quantity in the processing chamber, wherein the variable cleaning relationship comprises a function that outputs the cleaning operation parameters based on a current value of the deposition thickness property data; and cause, based on the cleaning operation parameters, a cleaning operation in the processing chamber.

16. The system of claim 15, wherein the deposition thickness property data comprises a deposition thickness counter that accumulates deposition thickness values from multiple semiconductor processing operations, and wherein the processing device is to further reset the deposition thickness counter after the cleaning operation is performed.

17. The system of claim 15, wherein the cleaning operation parameters further comprise a quantity of clean time.

18. The system of claim 15, wherein:

the processing chamber comprises a plurality of substrate processing areas; and the processing device is to further determine the cleaning operation parameters based on the deposition thickness property data of at least one of the plurality of substrate processing areas and the variable cleaning relationship of the process recipe.

19. The system of claim 15, wherein to provide the deposition thickness property data as the input to the variable cleaning relationship to determine cleaning operation parameters, the processing device is to:

provide the deposition thickness property data as the input to a trained machine learning model associated with the variable cleaning relationship; and receive, from the trained machine learning model, output associated with predictive data, wherein the cleaning operation parameters are based on the predictive data.

20. The system of claim 19, wherein the trained machine learning model is trained using data input comprising historical deposition thickness property data and target output comprising historical performance data.

* * * * *